Nov. 23, 1965 C. F. MILLER 3,219,748

SEMICONDUCTOR DEVICE WITH COLD WELDED PACKAGE
AND METHOD OF SEALING THE SAME

Filed Dec. 4, 1961 2 Sheets-Sheet 1

INVENTOR.
Charles Fredrick Miller
BY
Mueller & Aichele
ATT'YS.

INVENTOR.
Charles Fredrick Miller
BY Mueller & Aichele
ATT'YS.

United States Patent Office 3,219,748

Patented Nov. 23, 1965

3,219,748
SEMICONDUCTOR DEVICE WITH COLD WELDED PACKAGE AND METHOD OF SEALING THE SAME

Charles Fredrick Miller, Phoenix, Ariz., assignor to Motorola, Inc., Chicago, Ill., a corporation of Illinois Filed Dec. 4, 1961, Ser. No. 156,768
1 Claim. (Cl. 174—52)

This invention relates to the semiconductor art and to the cold welding of housings for semiconductor devices. In particular, the invention relates to a method of assembling a housing for a semiconductor device, and of sealing the housing by a cold pressure welding step in which a structural part of the housing assembly cooperates with a die to squeeze two flange portions of the housing and form a weld which joins the flanges together. The structural part just referred to serves as a mounting member in the completed semiconductor device, and the invention includes the product as well as the method subject matter.

The semiconductor unit of a transistor, or other semiconductor device, is adversely affected by exposure to the atmosphere. At the present time, one of the most reliable ways of isolating the semiconductor unit from the atmosphere is to enclose it within a hermetically sealed housing. Such housing assemblies have been sealed in a commercially acceptable manner by several different methods, including swaging, soldering, electrical resistance welding, and cold welding. Each of these methods was developed outside the semiconductor art, and up to the present time, their uses in the semiconductor art, as a general matter, have been equivalent to sealing applications in other arts. The selection of a particular method to be used on a commercial scale for sealing a given type of semiconductor device involves several factors, including the cost of the sealing equipment, the effectiveness of the seal that is obtained, the configuration of the particular device involved, and the properties of the materials to be joined.

There has been increasing interest in the use of cold welding methods to seal housings for semiconductor devices, largely because the semiconductor device is not heated during the welding. Aside from cost considerations, a welded seal, whether formed with or without heat, is preferred for a semiconductor device as compared to a swaged seal, because a welded joint is less likely to be leaky or otherwise defective. However, the heat and electrical energy involved in electrical resistance welding (hot welding) may cause impurities to be introduced into the inside of the semiconductor housing. Cold welding does not have this drawback since the housing need not be heated. However, several specific problems have been encountered in attempting to seal semiconductor housing assemblies by cold welding on an economical mass production basis.

It has been particularly difficult to seal the housing of so-called power transistors by cold welding. One reason is that the housing parts of most commercially available power transistors are more massive than the equivalent parts of transistors designed for lower power applications, and such relatively massive parts cannot be cold welded effectively. Attempts to modify the available power transistor housings in order to permit sealing them by cold welding have generally resulted in housings and housing parts with complicated configurations. This complexity increases the cost of the transistor.

In addition, it has been found that hermetic seals produced by known cold welding methods have not been as consistently reliable as desired. The joint which results from some cold welding methods has a characteristic weak portion, and the metal at this weak point adjacent the weld can easily become ruptured, thus breaking the seal. Such rupturing occurs most often as a result of rough handling of the device during manufacture, shipment or use of the device. Furthermore, if the welded parts are stressed in any manner when the device is mounted in the equipment in which it is ultimately used, the weak portion adjacent the weld may break.

The product and method of the present invention represent an effective and practical solution to the problems discussed above. The invention provides a semiconductor device with a housing including three metallic parts which, in their assembled condition, form an enclosure for a semiconductor unit. Two of these parts have peripheral flanges which overlap the third part and are joined together by a cold weld providing a hermetic seal for the enclosure. In a specific product embodiment, one of the parts is a cap or cover, and another part is a heat conductive member that serves as a base on which the semiconductor unit is mounted and also serves as a closure for the cap. The third part of the housing preferably is a ring of hard metal which serves the function of an anvil or die-plate during the cold welding of the flanges. In the completed device, the same ring serves as a mounting member which can be fastened to a chassis or some other mounting structure of the equipment in which the semiconductor device is ultimately mounted. There has been no tendency for the cold weld seal of the housing described above to leak when the device is mounted in equipment. The housing of the invention is particularly advantageous for power transistors and other semiconductor devices having a relatively high power rating.

The cap member and the base member of the housing are preferably made of copper, since copper has the heat conducting properties required for the base and also is sufficiently plastic to permit cold welding of the flanges on the cap and base. The mounting member is preferably made of a harder and stronger metal such as steel in order for it to accomplish best its anvil function during the cold welding step and its mounting function in the completed device. A housing of the type just described is relatively inexpensive because the three parts are all simple and may be economically formed by stamping or forging, and also because copper, the more expensive of the two metals used for the housing, is not required for the entire housing.

The invention includes a method of assembling the housing and of sealing it by cold welding. Prior to the assembly operation, the cap member and the base member are preferably plated with oxidation resistant metallic material such as nickel or gold, or both. If such a plating is not provided, the flanges should be cleaned to remove surface oxides from them just before the cold welding step. The next step is to place the base member in the central aperture of the ring-like mounting member, thus forming a support assembly. A semiconductor unit, terminal units and connector members are assembled with the base member of the support assembly, and all of the parts of the resulting assembly are secured together, preferably by means of solder connections. The flange on the base member overlaps the mounting member about its central aperture, and the cap is placed on the base with the flange of the cap resting on the flange of the base.

The flanges are then cold welded. This is preferably accomplished by bringing a die with a ring-shaped work surface into contact with the flange of the cap, and then squeezing the flanges between the die and the mounting member, with the mounting member acting as an anvil. The term squeezing as used herein includes squeezing by impact as well as by gradual application of force. The work surface of the die preferably has a curved sectional configuration, and it indents the flange of the cap and causes metal at the interface between the two flanges to flow laterally and form a cold weld. The best welds have been obtained when the radius of curvature of the work surface of the die is from ½ to 2 times the total thickness of the two flanges in their assembled condition prior to welding.

The invention is illustrated in the accompanying drawings in which.

Figure 1:
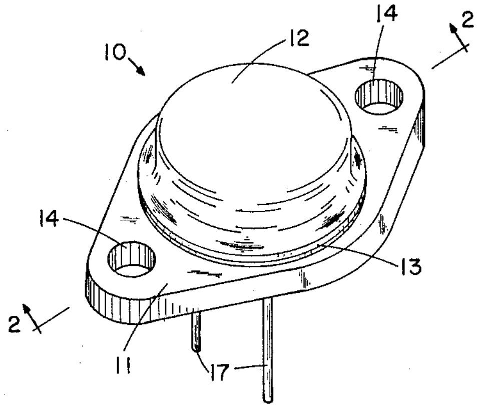
FIG. 1 is a perspective view of a power transistor which constitutes one product embodiment of the invention, and this view has been enlarged to about twice the actual size of the transistor.
Figure 2:
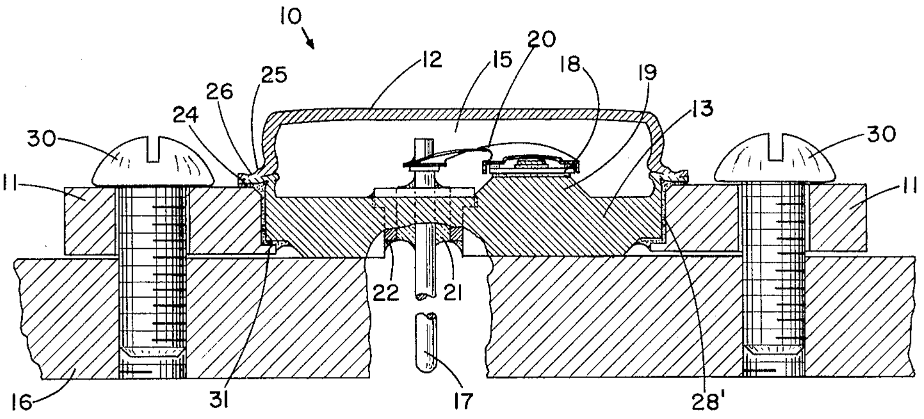
FIG. 2 is a further enlarged sectional view showing the transistor of FIG. 1 secured to a metallic chassis by bolts, with the section of the transistor itself being taken along line 2—2 of FIG. 1.

The semiconductor device 10 shown in FIGS. 1 and 2 is of the type known as a power transistor. Although the invention has been applied advantageously to power transistors, its utility is not limited to this particular device. For example, the invention can also be applied effectively to semiconductor rectifier diodes, Zener diodes and controlled rectifiers.

The power transistor 10 includes a mounting member 11, a cap 12 and a base or closure member 13 which together form the housing of the transistor. The mounting member 11 has two apertures 14 located on opposite sides of the cap 12, and these apertures are adapted to receive bolts or other fasteners in order to mount the transistor on a chassis or other mounting structure in the manner shown in FIG. 2. The bolts 30 extend through the apertures 14 of the mounting member 11 and secure the transistor to a metallic member 16, which may be part of a chassis or wall in equipment in which the transistor is used. The transistor 10 has two lead units 17 which include portions available on the outside of the transistor. The base member 13 serves as a third electrical terminal of the transistor since it is in electrical contact with the semiconductor unit 18 of the transistor, as will be further described. The base member 13 contacts the surface of the metallic member 16. Thus, the transistor may be connected in an electrical circuit by making connections to the external portions of the terminal units 17 and to the metallic member 16.

Referring to FIG. 2, it may be seen that the base member 13 and the cap 12 form an enclosure 15. A semiconductor unit 18 is mounted within the enclosure on a pedestal portion 19 of the base member 13. The terminal units 17 extend through the base member 13 and project into the enclosure 15. The upper end of each of the terminal units is connected by a respective connector arm 20 to the semiconductor unit 18. One of the terminal units is connected to the emitter portion of the semiconductor unit, and the other terminal unit is connected to the base portion of the semiconductor unit. The base member 13 is connected to the collector portion of the semiconductor unit. The two terminal units 17 are electrically isolated from each other and from the base member 13 by glass rings 21 through which they extend, and the glass rings have outer metal sleeves 22 which are soldered to the base member 13. The specific nature of the terminal units 17 and the connector members 20, and the manner in which they are secured to the housing and to the semiconductor unit 18, are not directly related to the present invention, and other terminal and connector configurations may be provided.

The base or closure member 13 is received within an aperture 23 which is located centrally of the mounting member 11. Thus, the mounting member has a ring-like configuration as shown best in FIG. 3. The base member 13 has an annular flange 24 which projects radially outward from the central portion of the base member and overlaps the portion of the mounting member 11 immediately surrounding the aperture 23 in it. The cap 12 has a similar annular flange 25 overlying the flange 24 of the base member, and these two flanges 24 and 25 are joined together by a cold weld which forms a hermetic seal for the enclosure 15. The weld is at the indented portion 26 of the flanges 24 and 25. The nature of the weld will be explained later in connection with the description of the method subject matter of the invention. It may be noted at this point, however, that since the flanges 24 and 25 overlap the mounting member 11, the flanges can be welded together by pressing them against the mounting member with a die such that the mounting member serves as an anvil in the welding step.

The mounting member 11 must withstand without permanent deformation the forces applied to it during the cold welding step and also those applied to it when the device is fastened to a chassis as shown in FIG. 2. Consequently, the mounting member 11 is preferably made of a hard, strong metallic material such as steel. The cap 12 and the base member 13, on the other hand, are preferably made of copper or some other metallic material which is relatively plastic and has relatively high heat conductivity. The metal of the flanges 24 and 25 in particular should be relatively plastic since a better weld is obtained with plastic metals. A heat conducting metal is required for the base member 13 because it serves to transfer heat generated within the semiconductor unit 18 in the electrical operation of the device to the chassis member 16 or an equivalent heat sink.

It may be seen in FIG. 2 that the bottom of the base member 13 projects slightly (.002 inch) beyond the bottom surface of the mounting member 11. The bottom of the base member is thus forced against the chassis 16 when the bolts 30 are tightened fully. The mounting member 11 bends slightly and transmits to the base member 13 that portion of the force generated by the bolts which acts to bend the mounting member. The steel material of the mounting member is advantageous in this respect since it transfers more force to the base member than would a weaker member. If the bottom of the base were flush with the bottom of the mounting member, no force would be transmitted to the base in the manner just described.

The method of assembling the transistor 10 of FIGS. 1 and 2 and of sealing the housing of the transistor will be described with reference primarily to FIGS. 3 to 6 inclusive. As a preparatory step, the cap 12 and the base member 13 are preferably plated with oxidation-resistant metallic material. The plating serves to prevent excessive oxidation of the surfaces of the flanges 24 and 25 which are to be cold welded. Copper material oxidizes rather readily, and surface oxides on copper can interfere with the cold welding step unless a protective plating is used, or unless the oxide material is removed just prior to the cold welding step. If the flanges are plated with oxidation resistant metal, no cleaning step is required before the cold welding is accomplished. Of course, if the material of the flanges is inherently oxidation-resistant, a plating step is not necessary. When the flanges are of copper, they may be plated with nickel or gold, or both. For example, satisfactory results have been obtained using a plating of nickel on the copper material of the cap and base with a plating of gold over the nickel. It is not essential that the same plating be used on the base and the cap. It is desirable to use a gold plating at least on the base member 13 since gold is highly solderable and provides more consistently reliable solder connections between the semiconductor unit 18 and the pedestal 19, and between the base member 13 and the mounting member 11. The member 11 may also be plated.

In assembling the transistor, a solder ring 28 is placed on the mounting member 11 about the central aperture 23, and the base member 13 is then placed in the central aperture 23 with the flange 24 of the base resting on the solder ring. The semiconductor unit 18, the terminal units 17 and the connectors 20 are assembled with the base member 13 along with pieces of solder for making the solder connections which secure these members to each other and to the base 13. The details of this particular assembly operation will not be described since they are not pertinent to the present invention. The semiconductor unit 18 is placed on the pedestal 19, and the terminal units 17 with the associated glass and metal sleeves 21 and 22 are received in apertures 29 in the base member.

Figure 3:
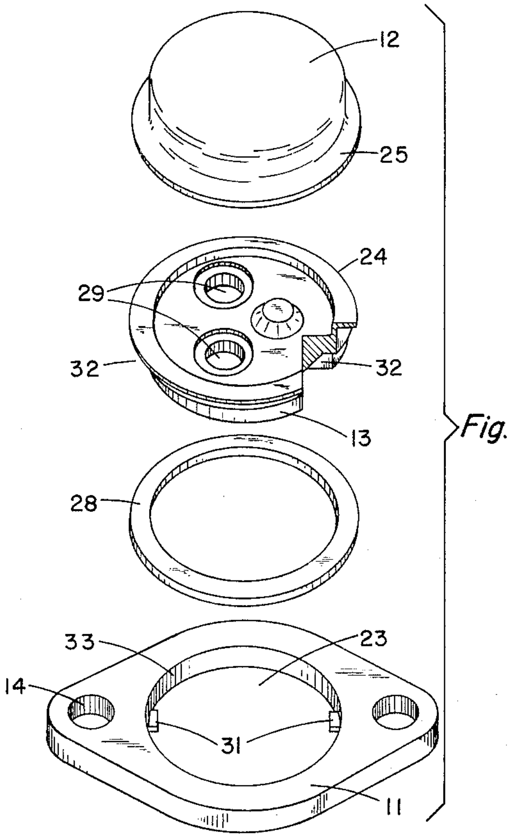
FIG. 3 is an exploded view to about the same scale as FIG. 1 showing the three metallic parts which form the housing of the transistor, and a solder ring which is assembled between the base member and the mounting member.

The mounting member may be provided with orienting tabs 31, and the base member may be similarly provided with recesses 32 to receive the tabs. In FIG. 3, a portion of the base member has been cut away to show one of the recesses 32. The base member 13 will fit in aperture 23 only when the tabs are received in the recesses, and this ensures that the base member has the desired orientation with respect to the mounting member.

The sub-assembly just described is passed through a soldering furnace in order to melt the various solder pieces and provide fused solder connections which secure the parts of the sub-assembly together. When the solder ring 28 melts, some of the solder runs down between the inner surface 33 of the mounting member and the opposed surface of the base member 13. This provides a fused solder connection 28′ which secures the base member to the inner surface 33 of the mounting member. The base member may be retained in the mounting member in any suitable way, and the solder connection is one practical way of accomplishing this. After the soldering step, the sub-assembly is etched and otherwise processed to clean up the semiconductor unit 18.

Figure 4:
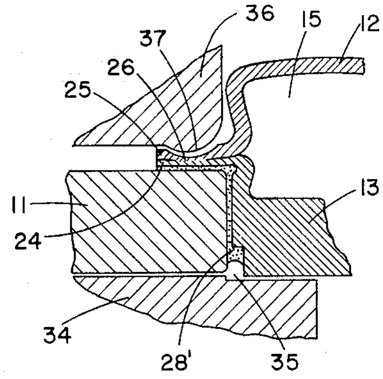
FIG. 4 is a fragmentary sectional view which illustrates the method of sealing the housing of the transistor by a cold welding step in accordance with the invention.
Figure 5:
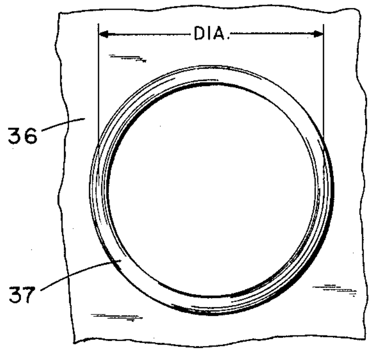
FIG. 5 is a plan view of the working surface of a die that is used in the welding step illustrated in FIG. 4.
Figure 6:
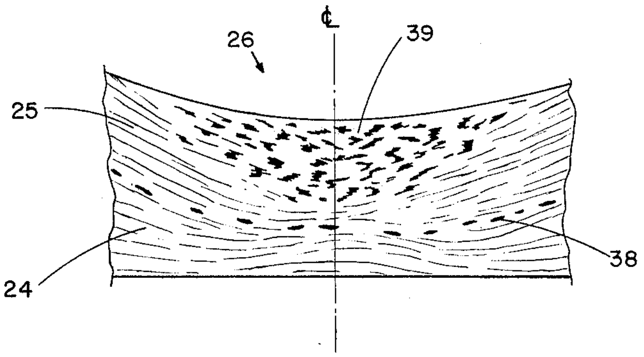
FIG. 6 is a greatly enlarged schematic view showing a section of the cold weld that is formed by the welding step of FIG. 4.

The cap 12 is cold welded to the base member 13 in the manner illustrated in FIGS. 4 to 6 inclusive. The assembly including the mounting member 11, the base member 13, the semiconductor unit 18 and the associated connections is placed in a cold welding press and rests on a plate 34. The plate 34 is slightly recessed at 35 to receive the projecting bottom of the base 13. A welding die 36 having a ring-shaped work surface 37 is brought into contact with the top of the flange 25. FIG. 5 illustrates the ring-like shape of the work surface 37 on the die 36. In FIG. 4, a fragmentary portion of the die 36 is shown in cross section, and it may be seen from this that the work surface 37 has a curved sectional configuration. Force is applied to the die 36, and the flanges 24 and 25 are squeezed between the die 36 and the mounting member 11. Thus, it may be seen that the mounting member 11 acts as an anvil or backing member during the cold welding step. The pressure exerted on the flanges 24 and 25 is sufficient to indent the upper surface of flange 25 and produce a lateral flow of metal at the interface between the two flanges. As a result of this indentation and flow of metal, the flanges are joined together by a cold weld 26 as shown in FIG. 4. The weld forms a hermetic seal for the enclosure 15.

The nature of the weld 26 is shown more fully in FIG. 6, which is a sectional view of the welded region taken from an actual photomicrograph enlarged 113 times over actual size. The interface which originally existed between the two flanges 24 and 25 can be identified only by some small spots or specks 38 of the metal plating which was provided on the flanges. This metal plating is dispersed in the cold welding step. It may be seen in FIG. 6 that at the center line of the weld, there is a region 39 just below the upper surface of flange 24 where little or no lateral flow of metal has occurred during the cold welding. The absence of metal flow in region 39 is confirmed by the comparatively large grain size of the metal in region 39 as it appears in a photomicrograph. By way of contrast, there has been extensive lateral flow of metal at and immediately adjacent to the interface 38, as evidenced by the very small grain size of the metal at the interface and other indicia of metal flow which is apparent in a photomicrograph of the weld.

The metal at the interfacial region tends to flow outward and upward about the region 39 where no significant lateral metal flow occurs. The metal in region 39 is essentially trapped by the forces developed in the flanges, and the trapped metal produces increased lateral flow of metal at the interfacial region which in turn produces a more uniform weld. It may be noted from FIGS. 4 and 6 that the weld is of substantially uniform thickness, there being no unduly thin regions in the weld such as is characteristic when a die with a flat-tipped work surface is used instead of a die with a curved work surface 37 as shown in FIGS. 4 and 5. It has been found that trapping of metal in the region 39 is promoted when the curved work surface 37 has a radius of curvature in the range from ½ to 2 times the total thickness of the flanges 24 and 25 as assembled prior to cold welding. Up to the present time, the best welds have been obtained using a work surface 37 on die 36 having a radius of curvature approximately equal to the total thickness of the flanges. During the welding step, the flanges are reduced in total thickness at least 60% at the center line of the weld. The best welds for the transistor 10 described above have been obtained when the thickness at the weld center line is reduced by about 70–75%. The two flanges 24, 25 should be of about the same hardness prior to welding. They should receive approximately the same degree of work hardening prior to the welding step, if they are work hardened at all as they normally would be when they are fabricated. Certain dimensions and other data connected with the flanges and the die 36 are presented by way of example in Table I as follows, but this data is not intended to limit the invention in any way.

*Table I*

| | |
|---|---|
| Material of die 36 | Tool steel. |
| Radius of curvature of work surface 37 | .037 inch. |
| Ring diameter (center line) of work surface 37 | .846 inch. |
| Hardness of die 36 | Rockwell C, 60–62. |
| Finish of work surface 37 | Hard chrome plated .008 max. thickness. |
| Total thickness of flanges 24, 25 as assembled | .040 inch. |
| Final thickness of weld 26 at center line | .010 inch. |
| Welding force | 5.75 tons. |
| Deformation of flanges 24, 25 | 70–75%. |

It is apparent from the foregoing description that the semiconductor device of the invention has several advantages as compared to semiconductor devices of the prior art. The cold weld of the device is an effective hermetic seal, and since it is formed without heating the device, impurities are not introduced into the device during welding. This helps to assure a high level of product uniformity and reliability. The device and its parts and sub-assemblies all have simple configurations, and the parts can be stamped or forged economically so that the cost of the device is kept low. The use of steel for the mounting member of the device further decreases its cost.

The method of assembling the device is also straightforward. The parts of the housing may be assembled rapidly on a mass production basis, and no unusually stringent dimensional tolerances for the parts are required. All soldering is accomplished in a single soldering step. Since the copper parts are plated with oxidation resistant metal prior to assembling the device, the surfaces to be welded need not be cleaned to prepare them for the welding step. The mounting member of the device serves as an anvil or backing member during the cold welding step, and consequently only a single die is required in the welding apparatus, which minimizes tooling costs. Also, since only one die is required, alignment problems connected with multiple-die welding apparatus are avoided. The cold welding step using a die with a curved work surface having a radius of ½ to 2 times the thickness of the work produces uniform, reliable welds which have shown no tendency to pull apart when the transistor is mounted in equipment. It has been found that the electrical parameters of the completed semiconductor device are more stable over a long period of aging under operating conditions than those of equivalent devices sealed by hot welding.

I claim:

In a semiconductor device which includes a semiconductor unit, and at least one lead unit connected to said semiconductor unit within the device and having a portion outside the device available for making external connections to the device, a housing assembly completing said device and including in combination, a one-piece mounting member of relatively hard, strong metal, said mounting member having a central aperture therein and having first and second mounting apertures therein on opposite sides of said central aperture, a base member of metallic material retained within said central aperture and including a flange portion of said metallic material overlying said mounting member adjacent said central aperture, said base member retaining said lead unit therein and having said semiconductor unit mounted on one side thereof, with the opposite side of said base member projecting slightly beyond the corresponding side of said mounting member so that said mounting member is adapted to force said base member against an external mount upon fastening such mounting member to such mount at said mounting apertures, and a cap of metallic material covering said semiconductor unit and including a flange portion of said metallic material cold welded to said flange portion of said base member providing a hermetically sealed enclosure, with the metallic material of said base member and of said cap having greater plasticity and greater heat conductivity than the metal of said mounting member.

References Cited by the Examiner

UNITED STATES PATENTS

| | | | |
|---|---|---|---|
| 2,881,370 | 4/1959 | Colson | 317—234 |
| 2,896,136 | 7/1959 | Hales. | |
| 2,932,684 | 4/1960 | Hales et al. | 174—52 X |
| 2,941,688 | 6/1960 | Chamberlin et al. | |
| 2,975,928 | 3/1961 | Roovers | 29—470.1 X |

ROBERT K. SCHAEFER, *Acting Primary Examiner.*

JOHN P. WILDMAN, LARAMIE E. ASKIN, *Examiners.*